(12) United States Patent
Chen et al.

(10) Patent No.: US 6,865,065 B1
(45) Date of Patent: Mar. 8, 2005

(54) SEMICONDUCTOR PROCESSING CHAMBER SUBSTRATE HOLDER METHOD AND STRUCTURE

(75) Inventors: Jiong Chen, San Jose, CA (US); Jihliang Chen, Saratoga, CA (US); Jianmin Qiao, Fremont, CA (US)

(73) Assignee: Advanced Ion Beam Technology, Inc., San Jose, CA (US)

( * ) Notice: Subject to any disclaimer, the term of this patent is extended or adjusted under 35 U.S.C. 154(b) by 130 days.

(21) Appl. No.: 10/054,373

(22) Filed: Jan. 22, 2002

(51) Int. Cl.[7] .............................................. H05F 23/00

(52) U.S. Cl. ...................... 361/234; 361/233; 361/749; 361/750; 438/457

(58) Field of Search ................................. 361/234, 233, 361/749, 750; 438/457

(56) References Cited

U.S. PATENT DOCUMENTS

| | | | |
|---|---|---|---|
| 4,692,836 A | * | 9/1987 | Suzuki ........................ 361/234 |
| 5,099,571 A | | 3/1992 | Logan et al. |
| 5,218,209 A | * | 6/1993 | Takeyama ............... 250/440.11 |
| 5,793,192 A | * | 8/1998 | Kubly et al. ................ 323/312 |
| 6,141,203 A | * | 10/2000 | Sherman ...................... 361/234 |
| 6,156,623 A | * | 12/2000 | Hendrix et al. ............. 438/457 |

* cited by examiner

*Primary Examiner*—Dean A. Reichard
*Assistant Examiner*—Anton Harris
(74) *Attorney, Agent, or Firm*—Bradley T. Sako

(57) ABSTRACT

A method and system for processing wafers is disclosed. According to one embodiment (100) a chuck system (102) may be situated opposite to an input source (104). A chuck system (102) may apply a force (e.g., mechanical and/or electromagnetic) that deforms a substrate (108). Once deformed, essentially all of a substrate (108) may be oriented at a predetermined angle (e.g., 90°) with respect to an input source (104).

20 Claims, 4 Drawing Sheets

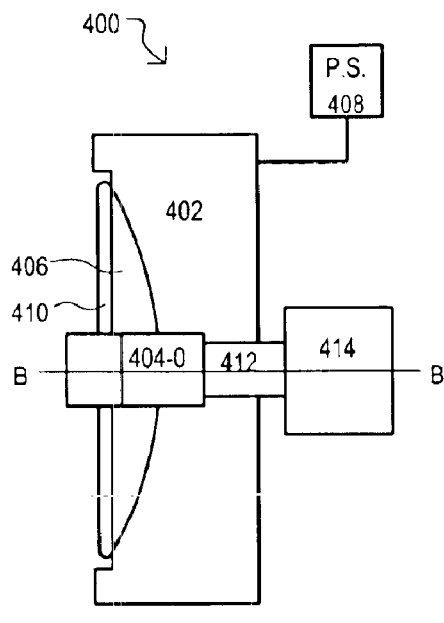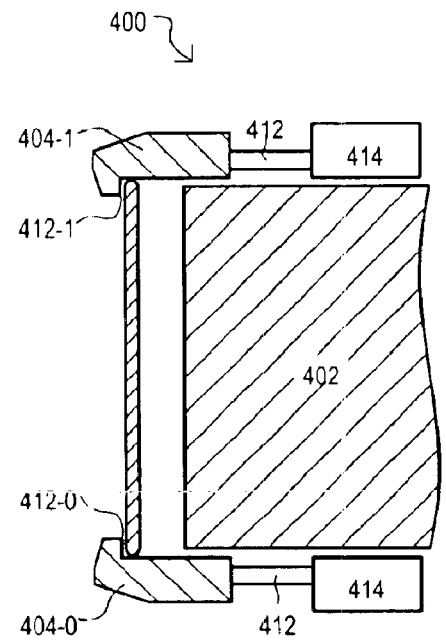
FIG. 4A　　　　　　　　　　FIG. 4B
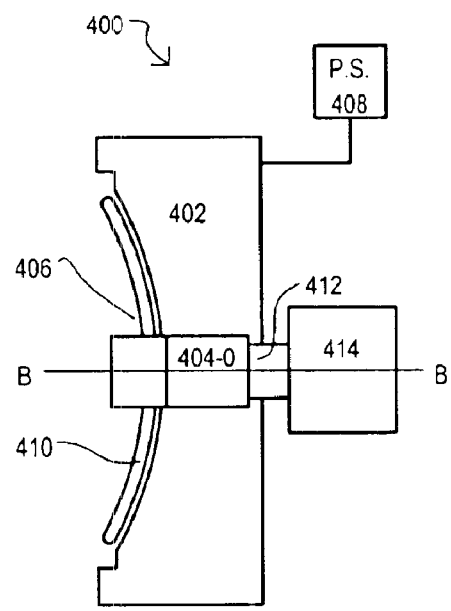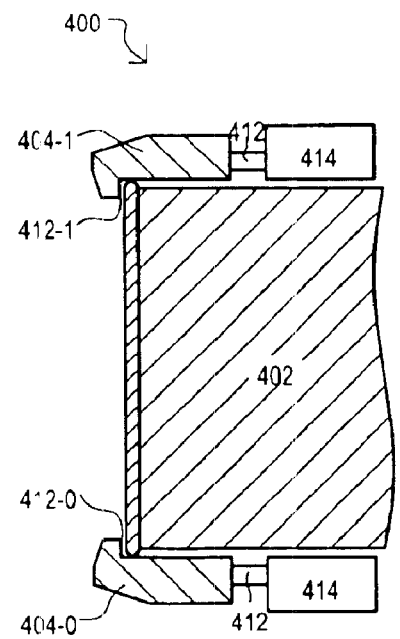
FIG. 4C　　　　　　　　　　FIG. 4D

BACKGROUND

SEMICONDUCTOR PROCESSING CHAMBER SUBSTRATE HOLDER METHOD AND STRUCTURE

TECHNICAL FIELD

The present invention relates generally to semiconductor processing, and more particularly to methods and structure for achieving uniform processing on a substrate surface.

BACKGROUND OF THE INVENTION

Semiconductor processing can typically involve multiple steps for modifying a substrate in some manner. In many steps, a wafer may be exposed to an input source that may alter a layer in some sort of manner. As but a few examples, in the case of a deposition step, an input source may provide one or more dissociated molecules. In the case of an ion implantation step, an input source may be an ion beam. In a photolithography process, an input source may be a light source, or the like.

For some steps, wafer orientation with respect to an input source may not be a concern. However, for other process steps it can be beneficial to orient a wafer at a predetermined angle with respect to an input source. For example, the effectiveness of some process steps may be optimized by orienting a substrate to be essentially perpendicular to an input source.

Provided an input source is sufficiently large in size it can be possible to orient a wafer at a predetermined angle with respect to the input source. One such example is shown in FIG. 5. FIG. 5 is a diagram illustrating a chemical vapor deposition (CVD) system 500. A CVD system 500 may include a reaction chamber 502 in which an input source 504 may be situated opposite to a chuck 506. A chuck 506 may hold a wafer 508 that is to be processed. In the example of FIG. 5, an input source 504 may be a "shower head" type faceplate that is specifically designed to be larger than a wafer 508. Consequently, it can be possible to orient a wafer substrate at a predetermined angle (e.g., 90°) with respect to an input source. As another example, in a sputtering process, an input source may be a target that is larger than wafer. In such a case, a wafer substrate may be situated opposite to the target at a predetermined angle. Thus, some process steps, by providing an input source that is greater in size than a wafer, are capable of orienting a wafer substrate at a particular angle to the input source.

However, in some processes an input source remains smaller than a wafer. Still further, as processing technology has continued to advance, wafer size has grown correspondingly. As a result, there are many conventional process steps in which it may not be possible to orient essentially all portions of a substrate at the same angle (e.g., 90°) with respect to an input source. An example of such a process step is shown in FIG. 6. FIG. 6 is a diagram showing an ion implantation step in a manufacturing process. An ion implantation system 600 may include an ion source 602 that can accelerate a beam of ions 604 toward a wafer holding surface 606. A wafer 608 may be situated on a surface 606 by a chuck system, or the like.

In FIG. 6, an ion source 602 can be smaller than a wafer 608. Consequently, in order to impact the edges of a wafer 608, an ion beam may scatter up to an angle shown as $\alpha$. Thus, ions from beam 604 can have an angle of incidence that ranges from 90° to an angle show as $\beta$. Variations in angle of incidence can lead to variations in a resulting dopant profile within a wafer substrate. This may lead to device properties that are undesirably non-uniform.

Various approaches for providing a more uniform process result have included attempting to manipulate the position of a wafer as it is being processed. However, such approaches tend to average a range of incidence angles with respect to an input source, rather than provide essentially the same incidence angle for an entire substrate.

U.S. Pat. No. 5,218,209 issued to Takeyama on Jun. 8, 1993 discloses an ion implanter having a wafer holding disk that includes curved wafer holding surfaces. Wafers are placed on the curved wafer holding surface, and the wafer holding disk may then be rotated. The resulting centrifugal force can push the wafers against the curved surface, thereby curving the wafers. The curve introduced into the wafers can result in an ion beam being always perpendicular to a wafer surface. A drawback to the approach of Takeyama can be the size and mechanical complexity of a machine. Such equipment may require a relatively large wafer holding disk and equipment sufficient for spinning such a wafer holding disk at a high enough speed to cause a desired curvature.

In order for many processing steps to be successful, a machine may include some way of holding a substrate (e.g., a wafer) in place. Takeyama, described above, includes a wafer holding surface that appears to rely on centrifugal force to hold wafers in place. Alternate approaches may utilize some sort of chuck system, as also noted above.

Chuck systems may include mechanical chucks, electrostatic chucks, or some combination thereof. A mechanical chuck can include a mechanical clamping mechanism for holding a wafer in place. In addition, in environments having some sort of pressure, a chuck may hold a wafer in place using a vacuum source. Mechanical chucks can be undesirable as clamping mechanisms may obstruct an input source, or require certain mechanical pieces be included in a processing chambers. Vacuum chucks typically do not provide sufficient suction in low pressure environments.

Electrostatic chucks (ESCs) can rely on potential differences between a wafer and a chuck surface to provide an attractive force between the two. ESCs may include single electrode (monopole) ESCs and split electrode ESCs. In a single electrode ESC, a wafer may be held at one potential while a chuck may be held at another. A drawback to single electrode systems is that electrical contact to a wafer is typically required. This may not be compatible with certain processes and/or a given wafer state (the wafer is covered with an insulator).

In a split electrode ESC, a chuck may include one or more electrodes at different potentials. A wafer can be inherently at a potential different than one or more electrodes, and thus be attracted to such electrodes. A split electrode may make physical contact with a wafer through an insulating material and/or a semiconductive material. Advantageously, in a split ESC arrangement, a particular potential does not to be supplied to the wafer itself.

While various conventional chuck systems may secure a wafer in place, such systems hold a wafer to a flat surface. Consequently, such systems do not seem capable of orienting essentially all of a substrate at a particular angle with respect to a limited size input source, such as that shown in FIG. 6.

In light of the above discussion, it would be desirable to provide some way of orienting a substrate at a particular angle, such as 90°, with respect to a limited size input source.

SUMMARY OF THE INVENTION

The present invention may include a method and system for processing a substrate. A system may include a chuck system opposite to an input source that receives a substrate for processing. A chuck system may apply a force to a substrate that bends the substrate so that essentially all of the substrate is at a predetermined angle with respect to the input source.

According to one aspect of the embodiments, a system may include an ion implanter having an input source that provides a beam of ions. A chuck system may receive a semiconductor wafer for ion implantation.

According to another aspect of the embodiments, a chuck system may include an electrostatic chuck (ESC) that can hold a substrate in a deformed shape for processing.

According to another aspect of the embodiments, a chuck system may include a movable portion and a stationary portion. A movable portion may apply a force to curve to the substrate into a deformed shape. A movable portion may include an ESC that generates an electrostatic force between a substrate and the ESC. In addition, or alternatively, a movable portion may apply a mechanical force by pressing against a portion of a substrate.

According to another aspect of the embodiments, a chuck system may include a wafer receiving portion having a curved shape. A curved shape may include a spherical curve, or a conical curve, or a cylindrical, or some combination of curves. According to a force applied by the chuck system, a substrate may conform to the curved shape.

BRIEF DESCRIPTION OF THE DRAWINGS

FIGS. 4A to 4D are side and cross sectional views of a chuck system according to another embodiment.

DETAILED DESCRIPTION OF THE EMBODIMENTS

The various embodiments illustrate systems for placing a substrate at a particular orientation with respect to an input source. A substrate, such as a wafer, may be curved so that essentially all of a substrate is oriented at the same angle with respect to an input source. In a particular embodiment, semiconductor wafers may be curved to provide an essentially perpendicular angle of incidence between an ion beam source and the wafer substrate.

It is understood that the various figures are not drawn to scale, and may include exaggerated curvatures to better understand the present invention.

Figure 1:
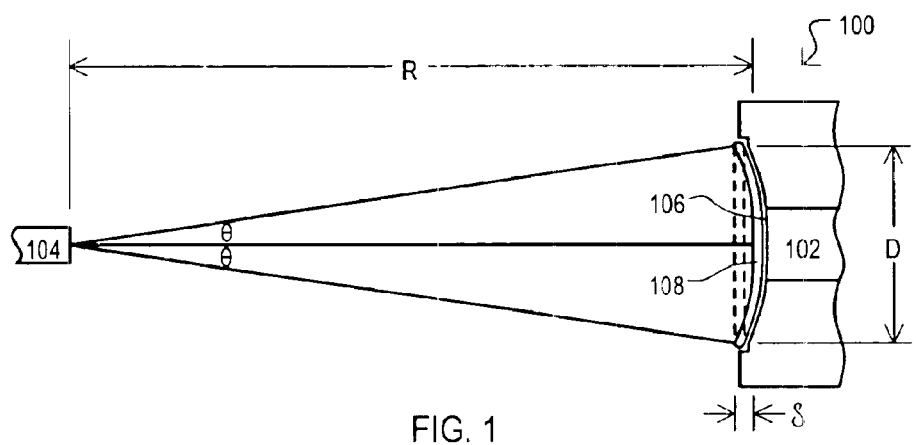
FIG. 1 is a diagram showing a system according to one embodiment.

Referring now to FIG. 1, a diagram is set forth illustrating a system according to one embodiment. A system 100 may include a chuck assembly 102 that can face an input source 104. A chuck assembly 102 may include a recessed portion 106 for receiving a wafer 108. When a wafer 108 is forced against a recessed portion 106, a wafer 108 may be curved in such a way that essentially the entire wafer surface is at a predetermined angle with respect to an input source. In the particular example of FIG. 1, essentially all of a wafer 108 surface can be essentially perpendicular to input source 104.

It is noted that unlike other conventional approaches, a chuck assembly 102 may hold, or draw a wafer toward, a recess portion 106 through mechanical and/or electrostatic methods. This is in contrast to other systems that might place a wafer on a surface and bend a wafer with centrifugal force.

While curving/bending/distorting a wafer according to the present invention may be implemented for many process steps, one particular advantageous application can be ion implantation. By including a substrate deforming chuck, an ion implantation machine may be capable of providing an essentially perpendicular incidence angle for an ion beam over essentially all of a substrate surface. This can enable a more uniform dopant profile without necessarily having to spin a large wafer holding surface at a speed sufficient to apply a bending centrifugal force.

Figures 2A, 2B:
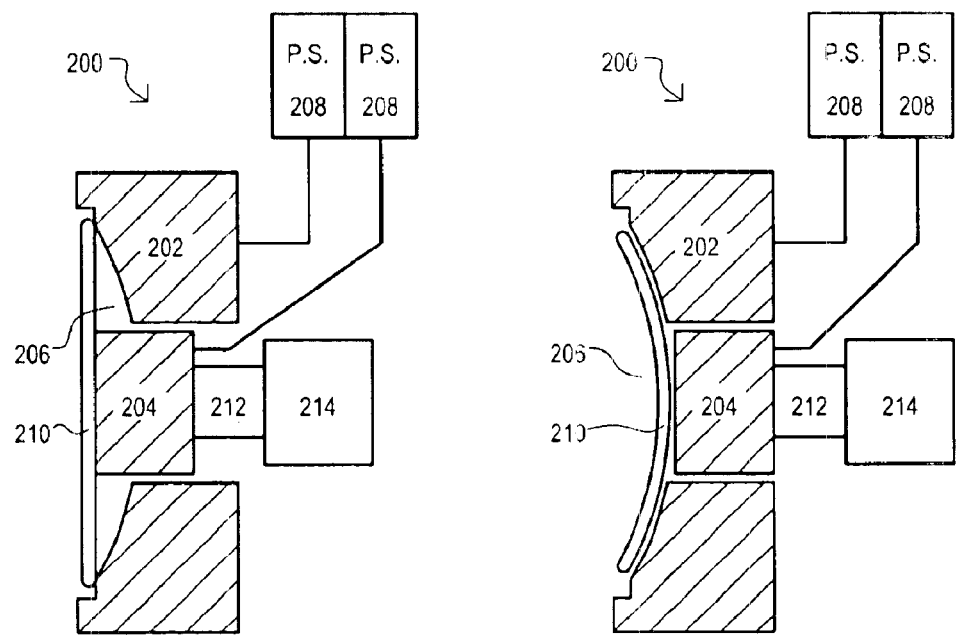
FIGS. 2A and 2B are side cross sectional views of a chuck system according to one embodiment.

Having described a general system according to one embodiment, a particular chuck system according to an embodiment will now be described. Referring now to FIGS. 2A and 2B, a chuck system is designated by the general reference character 200 and may include one or more stationary chuck portions 202 and one or more movable chuck portions 204. A movable chuck portion 204 may move within a recess portion 206. FIG. 2A shows a movable chuck portion 204 in a first (extended) position, while FIG. 2B shows the movable chuck portion 204 in a second (recessed) position.

While chuck portions 202 and 204 may take a variety of forms, in the particular example of FIGS. 2A and 2B, chuck portions (202 and 204) may include electrostatic chucks (ESCs). In an ESC case, a stationary chuck portion 202 and movable chuck portion 204 may both be connected to a power supply 208. Further, as is well know, those portions of an ESC chuck that contact a substrate (e.g., a wafer) may be covered with an insulating material and/or semiconductive material to maintain a potential difference between a substrate and a chuck assembly.

Chuck portions (202 and 204) may include single electrode chucks. In such a case, a wafer 210 could be biased to a different potential with respect to chuck portions (202 and 204) to thereby generate an electrostatic force that drives a wafer 210 toward chuck portions (202 and 204).

Alternatively, chuck portions (202 and 204) may include split electrode chucks. In such a case, chuck portions (202 and 204) may each include different electrodes biased to different potentials. Thus, it is understood in the split electrode case, a power supply 208 could provide two potentials to chuck portions (202 and 204).

The operation of a chuck assembly 200 having a split electrode arrangement will now be described.

Referring again to FIG. 2A, a wafer 210 may be placed against a chuck assembly 200. More particularly, a wafer 210 may be placed against both stationary and movable portions (202 and 204). Such an initial placement may be accomplished with mechanical apparatus, such as a robotic arm, hand placement by an operator, or some other method. With a wafer 210 in place, opposite voltages may be applied to split electrodes within a movable portion 204 and possibly a stationary portion 202, as well. With such voltages applied, a wafer 210 can be forced against a chuck assembly due to electrostatic forces.

Following an initial application of voltage, a movable chuck portion 204 may move to a recessed position, such as that shown in FIG. 2B. Such a movement can bend or otherwise elastically deform a wafer 210. Such a deformation can result in a curvature that matches an incidence angle for an input source. In one particularly advantageous application, a wafer 210 may be curved to present an essentially perpendicular angle of incidence over essentially all of a wafer 210 surface.

In the particular arrangement of FIGS. 2A and 2B, a movable chuck portion 204 may move essentially perpendicular to the initial position of a wafer 210. However, in alternate arrangements, it may be desirable to provide a movable portion that can move at an angle less than about 90°. Thus, the present invention should not be construed as being limited to one particular path of movement.

A chuck assembly may further include a connector 212 and driver 214. A connector 212 may be attached to a movable portion 204 and driver 214. When activated, a driver 214 can move a connector 212 away from a recess portion 206, and thus place a movable portion 204 in a recessed position. Thus, if an attracting voltage is applied to movable portion 204, as a movable portion 204 is driven toward a driver 214, a center portion of a wafer 210 can be moved as well, bending a wafer.

A connector 212 and driver 214 may take various forms. A connector 212 may be connected to a movable portion 204 in an insulated fashion, to isolate the electrostatic potential from a connector 212 and driver 214. A connector 212 may be moved by a driver 214 in a variety of ways, including various mechanical/electromechanical methods including, but not limited to, moving a connector 212 via threads or teeth formed thereon, or including servos for driving a connector 212.

FIGS. 2A and 2B have illustrated a case in which a movable portion is included to deform a wafer from a non-deformed shape into a deformed shape. Because an electrostatic field strength falls off with relation to the square of the distance between charges, such a system may advantageously position an ESC at a relatively close distance to a substrate. However, alternate embodiments that may generate sufficient electrostatic force could dispense with a movable portion if sufficient force could be generated by a stationary ESC to bend a wafer with a desired amount of curvature.

As shown in FIG. 2B, in one arrangement a curvature can be introduced into a wafer 210 according to the curvature of a recess portion 206. Which particular curvature is introduced can depend upon a particular application. Samples of different possible chuck assembly curvatures are shown in exaggerated form in FIGS. 3A to 3C.

Figure 3A:
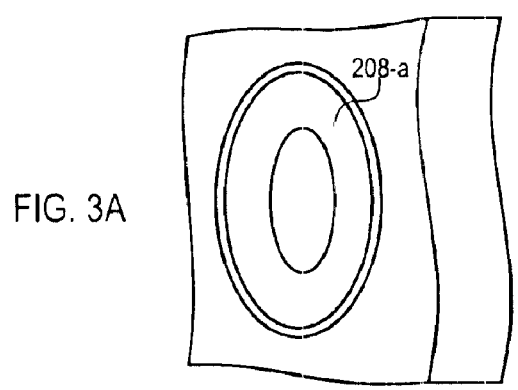
FIGS. 3A to 3C are diagrams illustrating various examples of curvature according to one embodiment.

FIG. 3A shows a recess portion 208-a having a spherical curvature. Such an arrangement may be advantageous in cases where a chuck assembly is directly opposite to an input source.

Figure 3B:
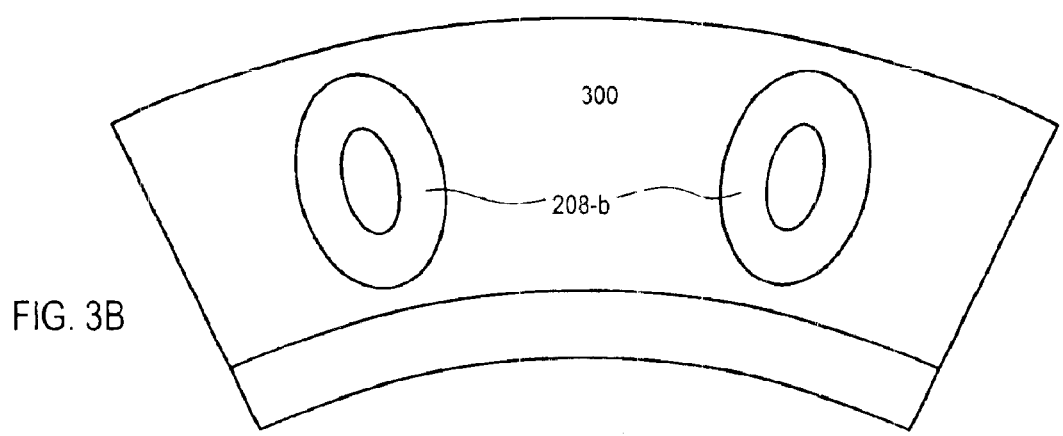

FIG. 3B shows a recess portions 208-b having a conical curvature. In FIG. 3B multiple recess portions 208-b may be formed on an annular, or conical section-shaped surface 300. Such an arrangement may be advantageous in cases where chuck assemblies are not directly opposite to an input source.

Figure 3C:
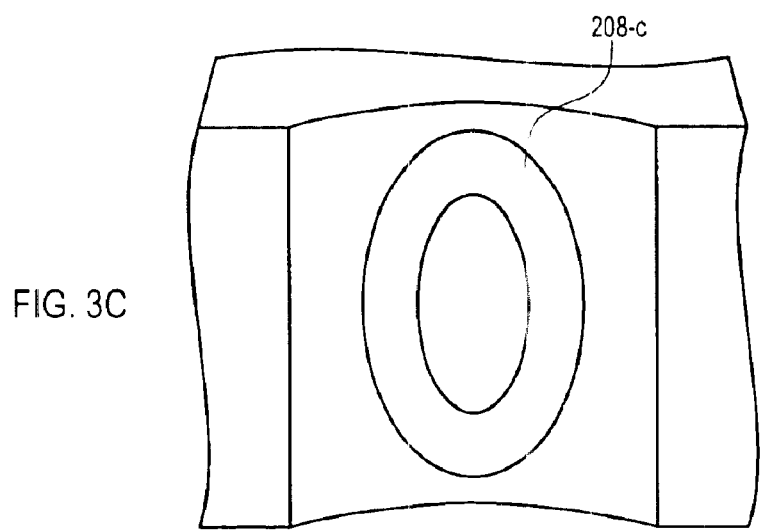
Figure 5:
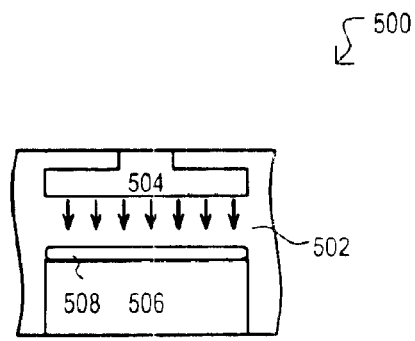
FIG. 5 is a diagram of a conventional system having a relatively large input source.
Figure 6:
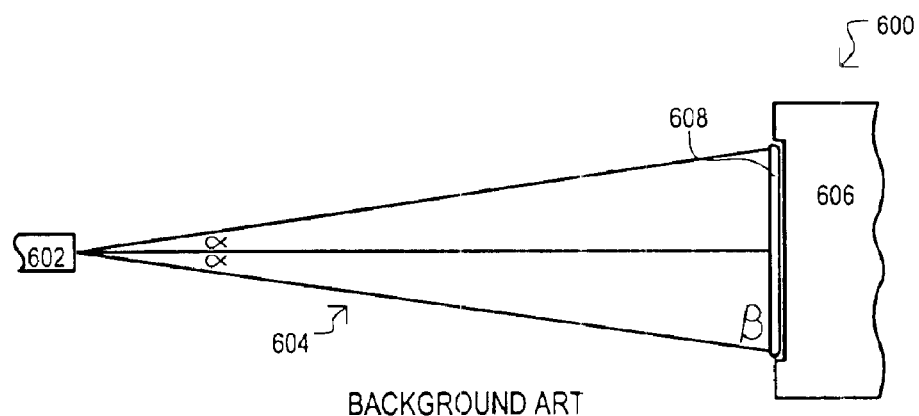
FIG. 6 is a diagram of a conventional system having a relatively small input source.

FIG. 3C shows a recess portion 208-c having a cylindrical curvature. Such an arrangement may be advantageous in a case where an input source, or resulting beam from an input source, has an essentially parallel stream in one dimension, but a varying incidence in another.

Of course, a large processing machine may include two or more different types of curvature. As but one example, a machine may include a targeting area that holds multiple wafers. A center portion of a targeting may include one or more chuck assemblies with a spherical curvature. A peripheral portion, that can surrounding a central portion, may include chuck assemblies with conical and/or cylindrical curvature.

While a chuck system, such as that shown in FIGS. 2A and 2B, may include only ESCs to deform a wafer, in some cases it may be desirable to include mechanical deformation techniques. For cases where cylindrical curvature is desired, a wafer may be initially deformed by movable clamping structures, and then held in place by an ESC arrangement. One example of such an approach is shown in FIGS. 4A–4C.

Referring now to FIG. 4A, a chuck system 400 is shown in a side view. The same chuck system 400 is shown in a cross sectional view in FIG. 4B, taken along line B—B of FIG. 4A. A chuck system 400 can include a stationary chuck portions 402 and movable chuck portions 404-0 and 404-1. Movable chuck portion 404-0/1 may move along outside edges of a recess portion 406. A stationary chuck portion 402 may include preferably include a split electrode ESC, and thus may be connected to a power supply 408. A chuck system 400 may preferably receive a wafer 410.

Referring again to FIGS. 4A–4D, movable chuck portions 404-0/1 can include contacting areas 412-0 and 412-1. As shown in FIGS. 4A and 4B, contacting areas 412-0/1 may be in contact with a surface of a wafer 410 in an unflexed, or essentially non-deformed state. Movable chuck portions 404-0/1 may then retract to a recessed position, shown in FIGS. 4C and 4D. Force applied at contacting areas 412-0/1 may deform a wafer 410 into a cylindrically curved shape.

In the event a stationary chuck portion 402 includes an ESC, power may then be applied to the ESC to hold a wafer 410 in place (in a deformed state). If desired, movable chuck portions 404-0/1 may then be moved away from the surface of a wafer 410.

Of course, in an alternate embodiment a stationary chuck portion 402 may not include an ESC, and movable chuck portions 404-0/1 may clamp a wafer 410 into a curved shape during processing.

Referring back to FIG. 1, an example of one way of introducing curvature will now be described. It will first be assumed that a substrate (e.g., wafer 108 diameter) has a size D. Further, the distance between an input source 104 will assumed to be R. From this relationship, a maximum substrate deflection, shown as δ, can be given by the following equation.

While a maximum deflection, such as that shown above, can be used to determine how to introduce a particular curvature into a wafer, particular examples will now be described that may be useful in understanding the invention.

It will first be assumed that a wafer to be processed is an "8-inch" wafer having a radius of 100 mm. Further, an optimal distance from an input source is assumed to be 3000 mm. Referring again to FIG. 1, the angle between the center and edge of a wafer 108, with respect to an input source 104 is given as θ calculated below.

$$\theta = \sin^{-1}(100/3000) = 1.9102°$$

From such an angle, a maximum curvature (deflection) value can be calculated as shown below.

$$\delta = 3000 - 3000 \cos(1.9102°) = 1.667 \text{ mm} = 0.0656 \text{ inches}$$

In some systems introducing a cylindrical curve into a wafer, an applied pressure of 5 psi may correspond to a maximum deflection of 5.5 inches. Thus, a require pressure for a 0.00656 inch deflection can be calculated as shown below.

Pressure for deflection=0.0656*(5 inch/5 psi)=0.0597 psi

A total force applied over a wafer may be generalized as follows.

Total Force=0.0597 psi*π(3.93 inches)²=2.896 lbs

In some systems introducing a spherical curve into a wafer, an applied pressure of 5 psi may correspond to a maximum deflection of 1.53 inches. Thus, a require pressure for a 0.00656 inch deflection can be calculated as shown below.

Pressure for deflection=0.0656*(1.53 inch/5 psi)=0.214 psi

A resulting total force for this case may be generalized as follows.

Total Force=0.214 psi*π(3.93 inches)²=2.896 lbs

Of course the above calculations are but examples of possible resulting forces for a very particular 8-inch wafer case. Differing systems and materials may include correspondingly different forces.

The above-described systems have illustrated systems and methods for deforming substrates (e.g., wafers). In some cases, such a deformation can enable essentially all of a substrate surface to be positioned at the same angle (e.g., about 90°) with respect to an input source. This may reduce or eliminate various conventional approaches for providing for a more uniform processing of a substrate (e.g., spinning or traversing a surface while processing).

However, it is understood that a chuck system according to the present invention can also move while being processed. Such movement may include spinning or traversing across the path of an input source, as but two examples.

Thus, it is understood that while the various particular embodiments have been set forth herein, methods and structures according to the present invention could be subject to various changes, substitutions, and alterations without departing from the spirit and scope of the invention. Accordingly, the present invention is intended to be limited only as defined by the appended claims.

What is claimed is:

1. A method, comprising the steps of:
   bending a substrate by applying a force with a movable chuck portion to orient essentially all of a surface of the substrate at a predetermined angle with respect to an input source, wherein
   applying the force with a movable chuck portion includes moving the movable chuck portion with respect to a stationary substrate receiving portion to band the substrate.

2. The method of claim 1, wherein:
   the substrate comprises a silicon wafer having a diameter of at least about eight inches.

3. The method of claim 1, wherein:
   the force comprises an electrostatic force generated by a potential difference between the substrate and the movable chuck portion.

4. The method of claim 1, wherein:
   the movable chuck portion comprises a split electrode electrostatic chuck.

5. The method of claim 1, wherein:
   bending the substrate includes receiving the substrate in a recess having a concave shape.

6. The method of claim 5, wherein:
   bending the substrate includes introducing a curvature into the substrate selected from the group consisting of spherical, conical and cylindrical.

7. The method of claim 1, wherein:
   applying the force with a movable chuck portion includes attracting the substrate to the movable portion with an electrostatic force when the substrate has an essentially unbent shape, and moving the movable chuck portion with respect to a stationary substrate receiving portion.

8. The method of claim 1, further including:
   attracting the substrate receiving portion to a curved stationary substrate receiving portion with an electrostatic force.

9. A method of processing a integrated circuit wafer, comprising the steps of:
   placing a wafer over a stationary concave chuck portion;
   applying a force by a moveable portion to the wafer to conform to the concave chuck portion;
   maintaining the wafer in the defined shaped as the wafer is processed with respect to an input source.

10. The method of claim 9, wherein:
    placing the wafer over the concave portion includes attracting the wafer with an electrostatic force to the concave portion.

11. The method of claim 10, wherein:
    attracting the wafer includes applying a voltage to an electrostatic chuck within the concave portion.

12. The method of claim 9, wherein:
    placing the wafer over the concave portion includes orienting the wafer in a first direction; and
    the force is applied with a movable chuck portion at an angle greater than 45° with respect to the first direction.

13. The method of claim 12, wherein
    placing the wafer over the concave portion includes contacting a stationary chuck portion with a first side of the wafer; and
    the force is applied by a movable portion to a second side of the wafer that is opposite to the first side.

14. The method of claim 12, wherein:
    placing the wafer over the concave portion includes contacting a stationary chuck portion with a first side of the wafer; and
    the force applied by the movable portion is an electrostatic force that attracts the first side of the wafer to the movable portion.

15. A system, comprising:
    an input source for processing the substrate according to a predetermined manufacturing step;
    a chuck system having
    a substrate receiving surface that receives the substrate in an essentially non-deformed shape, and
    a force applying portion, having a movable portion that moves with respect to the substrate receiving surface, that applies an attractive force between the substrate and the chuck system that maintains the substrate in a deformed shape.

16. The system of claim 15, wherein:
    the input source comprises an ion implantation source.

17. The system of claim 15, wherein:
    the substrate receiving surface has a type of curves selected from the group consisting of spherical, conical, and cylindrical.

18. The system of claim 15, wherein:
    the force applying portion includes a movable portion that moves with respect to the substrate receiving surface to change the substrate from the non-deformed shape to the deformed shape.

19. The system of claim 18, wherein:
    the force applied by the movable portion is selected from the group consisting of electrostatic force and mechanical force.

20. The method of claim 1, wherein:
    after bending the substrate, clamping the substrate to a recessed receiving portion to maintain the substrate in a bent state.

* * * * *